United States Patent
Ho et al.

(10) Patent No.: US 7,101,777 B2
(45) Date of Patent: Sep. 5, 2006

(54) METHODS FOR MANUFACTURING STACKED GATE STRUCTURE AND FIELD EFFECT TRANSISTOR PROVIDED WITH THE SAME

(75) Inventors: Tzu-En Ho, Jiaosi Township (TW); Chang-Rong Wu, Banciao (TW)

(73) Assignee: Nanya Technology Corporation, Taoyuan (TW)

( * ) Notice: Subject to any disclaimer, the term of this patent is extended or adjusted under 35 U.S.C. 154(b) by 147 days.

(21) Appl. No.: 10/864,320

(22) Filed: Jun. 10, 2004

(65) Prior Publication Data

US 2005/0074957 A1    Apr. 7, 2005

(30) Foreign Application Priority Data

Oct. 6, 2003    (TW) .............................. 92127712 A

(51) Int. Cl.
*H01L 21/3205*    (2006.01)

(52) U.S. Cl. ...................................... 438/592; 257/413

(58) Field of Classification Search ........ 438/652–656, 438/663, 664, 683, 592, 585; 257/412, 413, 257/388, E29.161, E21.199
See application file for complete search history.

(56) References Cited

U.S. PATENT DOCUMENTS

| 6,277,719 B1 * | 8/2001 | Chern et al. ................ 438/585 |
| 6,306,743 B1 * | 10/2001 | Lee ............................. 438/592 |
| 6,800,543 B1 * | 10/2004 | Taguwa ...................... 438/592 |

\* cited by examiner

*Primary Examiner*—David Vu
(74) *Attorney, Agent, or Firm*—Michael Bednarek; Pillsbury Winthrop Shaw Pittman LLP

(57) ABSTRACT

The present invention provides a method for manufacturing a stacked-gate structure in a semiconductor device. The method includes the steps of sequentially forming a gate dielectric layer, a poly-silicon layer, a titanium layer, and a $WN_X$ layer on a semiconductor substrate, carrying out a rapid thermal annealing (RTA) in a nitrogen ambient, forming a silicon nitride layer on the tungsten layer, and patterning the multilayer thin-film structure into a predetermined configuration.

16 Claims, 4 Drawing Sheets

METHODS FOR MANUFACTURING STACKED GATE STRUCTURE AND FIELD EFFECT TRANSISTOR PROVIDED WITH THE SAME

BACKGROUND OF THE INVENTION

1. Field of the Invention

The present invention generally relates to methods for manufacturing a stacked gate structure in a semiconductor device. More particular, the present invention relates to a method for manufacturing a stacked gate structure in a field effect transistor.

2. Description of Related Arts

Chip manufacturers have always tried to achieve higher device operating speed. Reduction of sheet resistance and contact resistance of a gate electrode is an effective way to accomplish the aforementioned goal. Therefore, a poly-Si/WN/W gate is now regarded as a potential structure in DRAM technology beyond 0.18 µm generation. The WN layer is used as a barrier layer which prevents inter-diffusion between silicon atoms in the poly-silicon layer and tungsten atoms in the WN/W layers. The sheet resistance of such gate structure is lower than 10 Ω/□, which is better than that of the conventional poly-Si/WSi structure.

FIGS. 1A and 1B are cross sectional views setting forth a conventional method for manufacturing a poly-Si/WN/W gate structure. To begin, a gate dielectric layer 102, a poly-silicon layer 104, a barrier layer 106, a tungsten (W) layer 108, and a silicon nitride layer 110 are sequentially formed on a semiconductor substrate 100, as shown in FIG. 1A. Thereafter, a lithography process and an etching process are performed and then the silicon nitride layer 110 is patterned to form a predetermined configuration, thereby obtaining a hard mask pattern 110A. Subsequently, the tungsten layer 108, the barrier layer 106, the poly-silicon layer 104 and the gate dielectric layer 102 are patterned to form the predetermined configuration, thereby obtaining a gate structure provided with a patterned gate dielectric layer 102A, a patterned poly-silicon layer 104A, a patterned barrier layer 106A and a patterned tungsten layer 108A, as shown in FIG. 1B.

Conventionally, the method used to form a barrier layer 106 is to form a $WN_X$ layer on the poly-silicon layer. Then, a rapid thermal annealing (RTA) process is performed in an $N_2$ ambient so that nitrogen atoms diffuse out from the $WN_X$ layer. As a result, the $WN_X$ layer is changed into the tungsten layer and a WN/SiN composite barrier layer is formed between the poly-silicon layer and the tungsten layer. However, SiN is an insulating material such that the resistance of the WN/SiN layer is raised.

SUMMARY OF THE INVENTION

It is an objective of the present invention to provide a method for manufacturing a stacked gate structure in a semiconductor device. The gate structure manufactured using such method is provided with lower gate sheet resistance and contact resistance.

To attain the objective, the present invention provides a method for manufacturing a stacked gate structure. The method comprises the steps of: 1) sequentially forming a gate dielectric layer, a poly-silicon layer, a metal layer and a $WN_X$ layer on a semiconductor substrate; 2) performing a rapid thermal annealing process in a nitrogen ambient; thereby forming a silicide layer, changing part of the $WN_X$ layer into a tungsten layer, and forming a barrier layer between the silicide layer and the tungsten layer; 3) patterning the tungsten layer, the barrier layer, the silicide layer and the poly-silicon layer to form a stacked gate structure.

In addition, the present invention provides another method for manufacturing a stacked gate structure, the method comprising the steps of: 1) sequentially forming a gate dielectric layer, a poly-silicon layer, a metal layer and a $WN_X$ layer on a semiconductor substrate; 2) patterning the $WN_X$ layer, the metal layer and the poly-silicon layer to form a stacked gate structure. 3) performing a rapid thermal annealing process in a nitrogen ambient; thereby forming a silicide layer, changing part of the $WN_X$ layer into a tungsten layer, and forming a barrier layer between the silicide layer and the tungsten layer.

Moreover, the present invention provides a method for manufacturing a field effect transistor, the method comprising the steps of 1) forming the stacked-gate structure consisting of a poly-silicon layer, a silicide layer, a barrier layer and a tungsten layer using the aforementioned method; 2) performing an ion implantation process, using the stacked gate electrode as a mask, to form spaced apart first source/drain regions in the semiconductor substrate; 3) forming a sidewall spacer adjacent to the stacked gate structure; 4) performing another ion implantation process, using the sidewall spacer as a mask, to form spaced apart second source/drain regions of higher doping concentration than the first source/drain regions.

DETAILED DESCRIPTION OF THE PREFERRED EMBODIMENTS

Figure 1A:
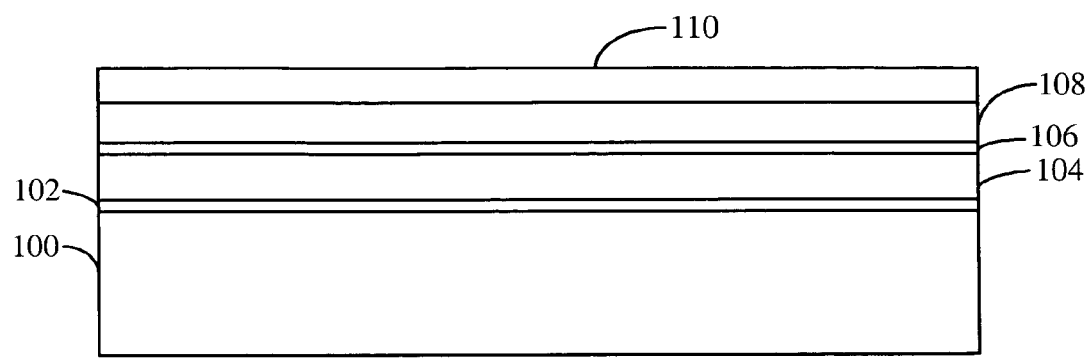
FIGS. 1A and 1B are cross sectional views setting forth for a conventional method for manufacturing a poly-Si/WN/W gate structure.
Figure 1B:
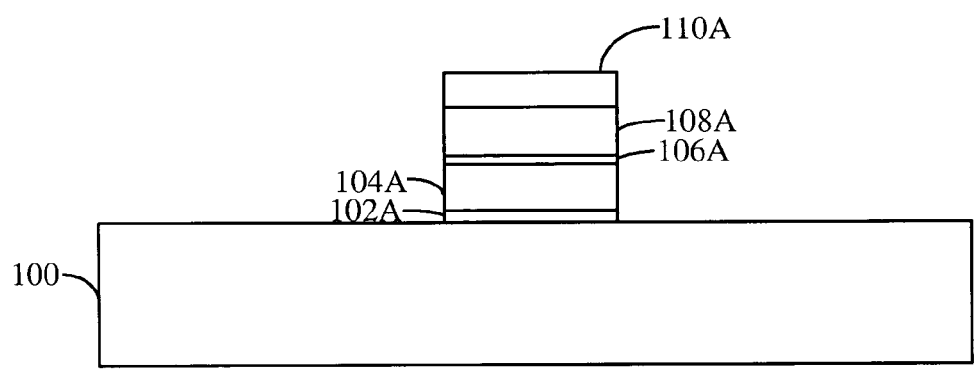
Figure 2A:
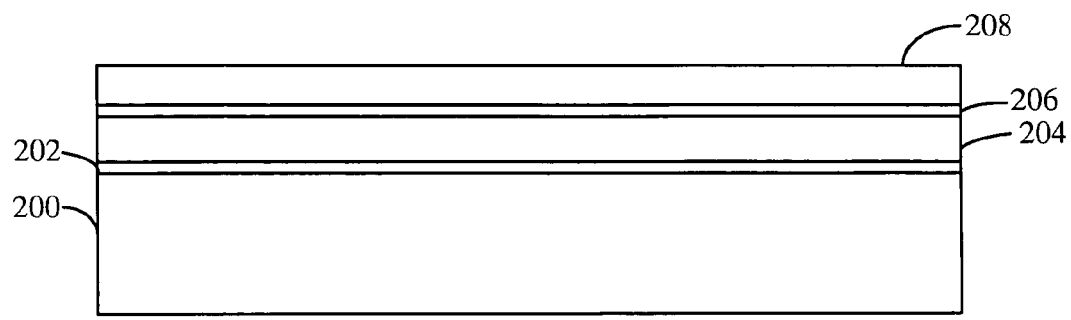
FIGS. 2A to 2C are cross sectional views setting forth a method for manufacturing a stacked gate structure in accordance with one preferred embodiment of the present invention.
Figure 2B:
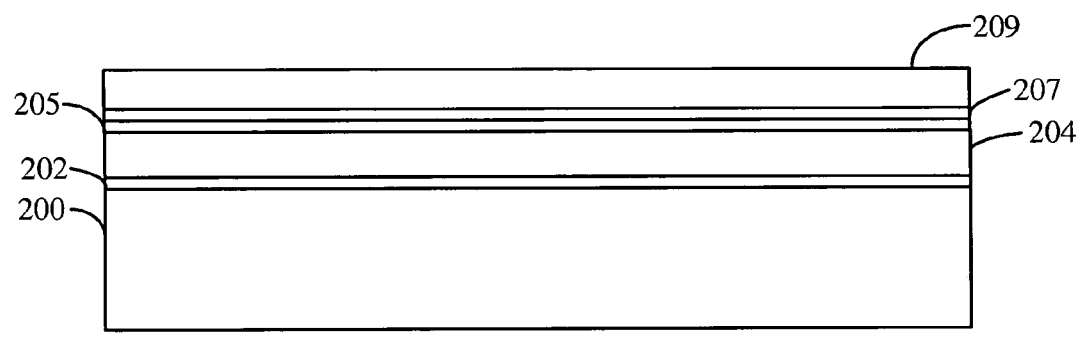
Figure 2C:
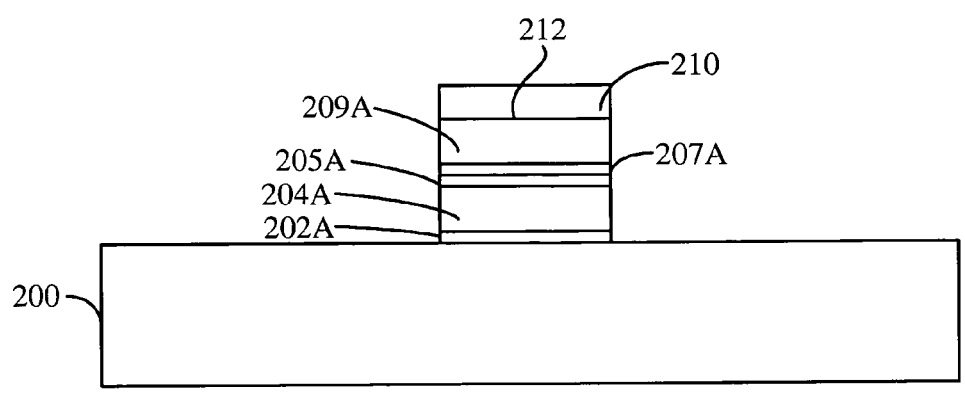

Referring to FIG.2A~2C, FIGS. 2A to 2C are cross sectional views setting forth a method for manufacturing a stacked gate structure in accordance with one preferred embodiment of the present invention. To begin, a gate dielectric layer 202, a poly-silicon layer 204, a metal layer 206 and a $WN_X$ layer 208 are formed on a semiconductor substrate 200, as shown in FIG. 2A. The gate dielectric layer 202 may be made of SiO2, $SiN_X$, $Si_3N_4$, SiON, $TaO_2$ or TaON. The thickness of the poly-silicon layer 204 is about 500~2000 angstroms and can be formed by chemical vapor deposition (CVD). The metal layer 206 may be made of titanium (Ti), cobalt (Co), nickel (Ni), platinum (Pt), tungsten (W), tantalum (Ta), molybdenum (Mo), hafnium (Hf) or niobium (Nb) and its thickness is about 5~30 angstroms. The metal layer 206 can be formed by chemical vapor deposition or physical vapor deposition. The $WN_X$ layer 208 is about 200~600 angstroms thick and can be formed by physical vapor deposition or sputtering. Thereafter, a rapid thermal annealing process is performed in a nitrogen ambient at 750~1150° C. for 60~120 seconds. During the process of the rapid thermal annealing, a silicide layer 205 is formed, as shown in FIG. 2B, as a result of the chemical reaction between the metal layer 206 and the poly-silicon layer 204. The formation of the silicide layer 205 can reduce the sheet resistance of the gate electrode and prevent the formation of SiN, whose resistance is rather high, as a result of the reaction between the nitrogen atoms in the $WN_X$ layer 208 and the silicon atoms in the poly-silicon layer 204. In addition, during the process of rapid thermal annealing, part of the nitrogen atoms in the $WN_X$ layer 208 diffuse along the grain boundaries and react with the metal layer. Therefore, a metal nitride layer is formed and can be used as a highly reliable diffusion barrier layer 207 to prevent the inter-diffusion between the silicon atoms in the poly-silicon layer and the tungsten atoms in the tungsten layer. On the other hand, part of the nitrogen atoms in the $WN_X$ layer 208 diffuse along the grain boundaries and dissipates in the nitrogen ambient. A tungsten layer 209 remains and the gate sheet resistance and the contact resistance can be reduced significantly. Subsequently, a silicon nitride layer is deposited on the tungsten layer 209. The silicon nitride layer has a thickness of about 500~3000 angstroms and can be formed by growth in the furnace or chemical vapor deposition in the chamber. At last, as shown in FIG. 2C, a photolithography process and an etching process are performed. Thereby, the silicon nitride layer is patterned to form a hard mask 210 consistent with the pre-determined configuration on the photo mask. Next, an etching process is performed to obtain a stacked gate structure provided with a patterned dielectric layer 202A, a patterned poly-silicon layer 204A, a patterned silicide layer 205A, a patterned diffusion barrier layer 207A and a patterned tungsten layer 209A.

Figure 3A:
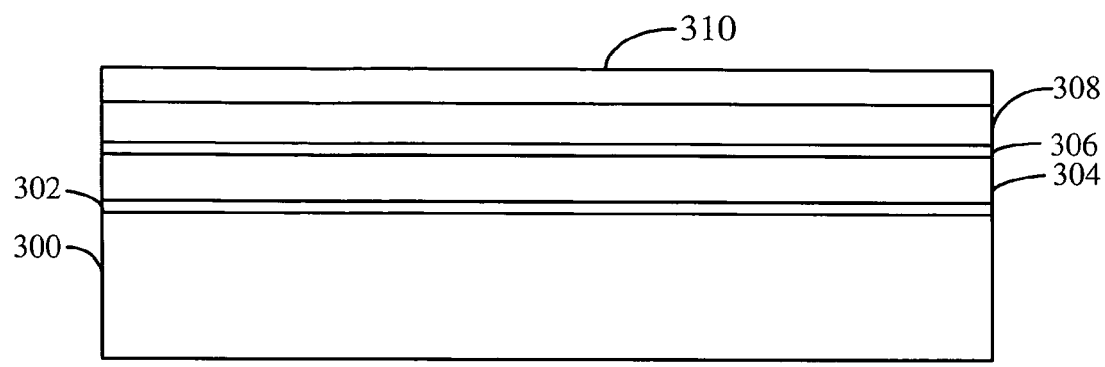
FIGS. 3A to 3C are cross sectional views setting forth a method for manufacturing a stacked gate structure in accordance with another preferred embodiment of the present invention.
Figure 3B:
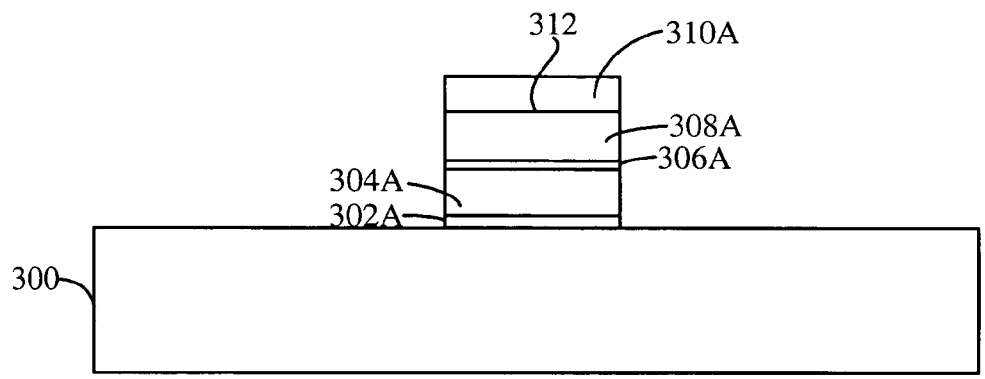
Figure 3C:
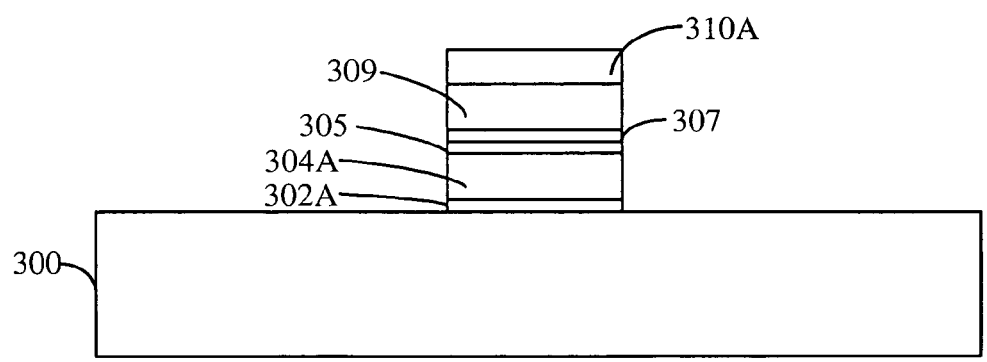

In addition, the present invention also provides another method for manufacturing a stacked gate structure, the method comprising the steps of sequentially forming a gate dielectric layer 302, a poly-silicon layer 304, a metal layer 306, a $WN_X$ layer 308 and a silicon nitride layer 310 on a semiconductor substrate 300, as shown in FIG. 3A. The gate dielectric layer 302 may be made of SiO2, $SiN_X$, $Si_3N_4$, SiON, $TaO_2$ or TaON. The thickness of the poly-silicon layer 304 is about 500~2000 angstroms and can be formed by chemical vapor deposition (CVD). The metal layer 306 may be made of titanium (Ti), cobalt (Co), nickel (Ni), platinum (Pt), tungsten (W), tantalum (Ta), molybdenum (Mo), hafnium (Hf) or niobium (Nb) and its thickness is about 5~30 angstroms. The metal layer 306 can be formed by chemical vapor deposition or physical vapor deposition. The $WN_X$ layer 308 is about 200~600 angstroms thick and can be formed by physical vapor deposition or sputtering. The silicon nitride layer 310 has a thickness of about 500~3000 angstroms and can be formed by growth in the furnace or chemical vapor deposition in the chamber. Thereafter, a lithography process and an etching process are performed. The silicon nitride layer is patterned to form a hard mask consistent with the pre-determined configuration on the photo mask. Next, an etching process is performed to get a stacked gate structure 312 provided with a patterned dielectric layer 302A, a patterned poly-silicon layer 304A, a patterned metal layer 306A and a patterned $WN_X$ layer 308A. Besides, there is a hard mask, a patterned silicon nitride layer 310A, on the stacked gate structure, as shown in FIG. 3B. Finally, a rapid thermal annealing process is performed in a nitrogen ambient at 750~1150° C. for 60~120 seconds, as shown in FIG. 3C. During the process of the rapid thermal annealing, a silicide layer 305 is formed as a result of the chemical reaction between the metal layer 306A and the poly-silicon layer 304A. The formation of the silicide layer 305 can reduce the sheet resistance of the gate electrode and prevent the formation of SiN, whose resistance is rather high, as a result of the reaction between the nitrogen atoms in the $WN_X$ layer 308A and the silicon atoms in the poly-silicon layer 304A. In addition, during the process of rapid thermal annealing, part of the nitrogen atoms in the $WN_X$ layer 308A diffuse along the grain boundaries and react with the metal layer 306A. Therefore, a metal nitride layer is formed and can be used as a highly reliable diffusion barrier to prevent the inter-diffusion between the silicon atoms in the poly-silicon layer 304A and the tungsten atoms in the tungsten layer 309. On the other hand, part of the nitrogen atoms in the $WN_X$ layer 308A diffuse along the grain boundaries and dissipates in the nitrogen ambient. Then a tungsten layer 309 remains and the gate sheet resistance and the contact resistance can be reduced significantly.

Figure 4:
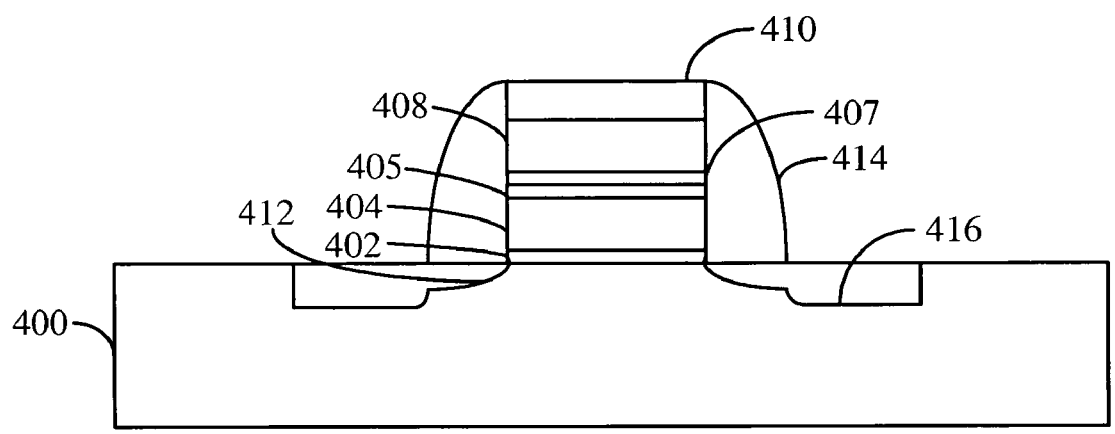
FIG. 4 is a cross sectional view setting forth a method for manufacturing a field effect transistor provided with a stacked gate structure in accordance with one preferred embodiment of the present invention.

Besides, the present invention also provides a method for manufacturing a field effect transistor. The steps of the method starts with forming a stacked gate structure provided with a patterned dielectric layer 402, a patterned poly-silicon layer 404, a patterned layer 405, a patterned layer 407 and a patterned tungsten layer 408 on the semiconductor substrate 400 using one of the aforementioned methods. There is a hard mask, a silicon nitride layer 410, on the stacked gate structure, as shown in FIG. 4. The ions are implanted into the semiconductor substrate 400 using the stacked gate structure as a mask, to form spaced apart first source/drain regions in the semiconductor substrate. A sidewall spacer 414 is formed on the sidewalls of the stacked gate structure. And then, ions are implanted into the semiconductor substrate 400 using the sidewall spacer as a mask, to form spaced apart second source/drain regions of higher doping concentration than the first source/drain regions.

In accordance with the present invention, during the process of rapid thermal annealing, a silicide layer is formed as a result of the chemical reaction between the metal layer and the poly-silicon layer. The formation of the silicide layer can reduce the gate sheet resistance and prevent the formation of SiN, whose sheet resistance is rather high, as a result of the reaction between the nitrogen atoms in the $WN_X$ layer and the silicon atoms in the poly-silicon layer. Therefore, a higher device operating speed can be obtained.

Although the description above contains much specificity, it should not be construed as limiting the scope of the invention but as merely providing illustrations of some of the presently preferred embodiments of the present invention. Thus, the scope of the present invention should be determined by the appended claims and their equivalents, rather than by the examples given.

What is claimed is:

1. A method for manufacturing a stacked-gate structure, the method comprising the steps of:
   a) sequentially forming a dielectric layer, a poly-silicon layer, a metal layer and a $WN_X$ layer on a semiconductor substrate;
   b) performing a rapid thermal annealing (RTA) process, thereby forming a silicide layer, changing a portion of said $WN_X$ layer into a tungsten layer, and forming a barrier layer between said silicide layer and said tungsten layer; and
   c) patterning said tungsten layer, said barrier layer and said silicide layer and said poly-silicon layer to form said stacked-gate structure.

2. The manufacturing method as claimed in claim 1, wherein said metal layer is made of metal selected from a group consisting of titanium, cobalt, nickel, platinum, tungsten, tantalum, molybdenum, hafnium and niobium.

3. The manufacturing method as claimed in claim 1, wherein said barrier layer is a composite layer of tungsten nitride and metal nitride.

4. The manufacturing method as claimed in claim 1, wherein, said rapid thermal annealing process is performed in a nitrogen ambient.

5. A method for manufacturing a stacked-gate structure, the method comprising the steps of:
   a) sequentially forming a dielectric layer, a poly-silicon layer, a metal layer and a $WN_X$ layer on a semiconductor substrate;
   b) patterning said $WN_X$ layer, said metal layer, and said poly-silicon layer to form said stacked-gate structure; and
   c) performing a rapid thermal annealing (RTA) process, thereby forming a silicide layer, changing part of said $WN_X$ layer into a tungsten layer, and forming a barrier layer between said silicide layer and said tungsten layer.

6. The manufacturing method as claimed in claim 5, wherein said metal layer is made of metal selected from a group consisting of titanium, cobalt, nickel, platinum, tungsten, tantalum, molybdenum, hafnium and niobium.

7. The manufacturing method as claimed in claim 5, wherein said barrier layer is a composite layer of tungsten nitride and metal nitride.

8. The manufacturing method as claimed in claim 5, wherein said rapid thermal annealing process is performed in a nitrogen ambient.

9. A method for manufacturing a field effect transistor, the method comprising the steps of:
   a) sequentially forming a dielectric layer, a poly-silicon layer, a metal layer and a $WN_X$ layer on a semiconductor substrate;
   b) performing a rapid thermal annealing (RTA) process, thereby forming a silicide layer, changing part of said $WN_X$ layer into a tungsten layer, and forming a barrier layer between said silicide layer and said tungsten layer; and
   c) patterning said tungsten layer, said barrier layer and said silicide layer and said poly-silicon layer to form said stacked-gate structure;
   d) performing an ion implantation process, using said stacked-gate electrode as masking, to form spaced apart first source/drain regions in said semiconductor substrate;
   e) forming a sidewall spacer adjacent to said stacked-gate structure;
   f) performing another ion implantation process, using said sidewall spacer as masking, to form spaced apart second source/drain regions of higher doping concentration than said first source/drain regions.

10. The manufacturing method as claimed in claim 9, wherein said metal layer is made of metal selected from a group consisting of titanium, cobalt, nickel, platinum, tungsten, tantalum, molybdenum, hafnium and niobium.

11. The manufacturing method as claimed in claim 9, wherein said barrier layer is a composite layer of tungsten nitride and metal nitride.

12. The manufacturing method as claimed in claim 9, wherein said rapid thermal annealing process is performed in a nitrogen ambient.

13. A method for manufacturing a field effect transistor, the method comprising the steps of:
   a) sequentially forming a dielectric layer, a poly-silicon layer, a metal layer and a $WN_X$ layer;
   b) patterning said $WN_X$ layer, said metal layer, and said poly-silicon layer into said stacked-gate structure;
   c) performing a rapid thermal annealing (RTA) process, thereby forming a silicide layer, changing part of said $WN_X$ layer into a tungsten layer, and forming a barrier layer between said silicide layer and said tungsten layer;
   d) performing an ion implantation process, using said stacked-gate electrode as masking, to form spaced apart first source/drain regions in said semiconductor substrate;
   e) forming a sidewall spacer on the ends of said stacked-gate structure;
   f) performing another ion implantation process, using said sidewall spacer as masking, to form spaced apart second source/drain regions of higher doping concentration than said first source/drain regions.

14. The manufacturing method as claimed in claim 13, wherein said metal layer is made of metal selected from a group consisting of titanium, cobalt, nickel, platinum, tungsten, tantalum, molybdenum, hafnium and niobium.

15. The manufacturing method as claimed in claim 13, wherein said barrier layer is a composite layer of tungsten nitride and metal nitride.

16. The manufacturing method as claimed in claim 13, wherein said rapid thermal annealing process is performed in a nitrogen ambient.

* * * * *